United States Patent
Tsai

(10) Patent No.: US 8,557,076 B2
(45) Date of Patent: Oct. 15, 2013

(54) METHOD OF FABRICATING AN ENVIRONMENTAL FRIENDLY CLADDING LAYER

(75) Inventor: Shih-Chuan Tsai, Taipei (TW)

(73) Assignee: Shih-Chuan Tsai, Taipei (TW)

( * ) Notice: Subject to any disclaimer, the term of this patent is extended or adjusted under 35 U.S.C. 154(b) by 669 days.

(21) Appl. No.: 12/726,344

(22) Filed: Mar. 18, 2010

(65) Prior Publication Data
US 2010/0178516 A1 Jul. 15, 2010

Related U.S. Application Data

(63) Continuation-in-part of application No. 11/431,698, filed on May 11, 2006, now abandoned.

(30) Foreign Application Priority Data

Jun. 24, 2005 (TW) ................................ 94121276 A

(51) Int. Cl.
*B32B 27/40* (2006.01)

(52) U.S. Cl.
USPC .............................................. 156/247; 156/60

(58) Field of Classification Search
USPC ................................................................ 156/247
See application file for complete search history.

(56) References Cited

U.S. PATENT DOCUMENTS

| 4,663,192 A | * | 5/1987 | Hatakeyama et al. | ........ 427/108 |
| 5,139,601 A | * | 8/1992 | Holmes-Farley et al. | .... 156/329 |
| 2004/0038026 A1 | * | 2/2004 | Li et al. | ........................ 428/354 |

* cited by examiner

*Primary Examiner* — Katarzyna Wyrozebski Lee
*Assistant Examiner* — Margaret Squalls
(74) *Attorney, Agent, or Firm* — CKC & Partners Co., Ltd.

(57) ABSTRACT

A method of fabricating an environmentally friendly cladding layer is provided. A metal layer is deposited on a hydrolysis film by a vacuum evaporation method. Then, after coating a polymeric adhesive layer on the metal layer, the hydrolysis film is immersed in water. After hydrolyzing the hydrolysis film, a substrate is adhered on the metal layer through the polymeric adhesive layer. Finally, the polymeric adhesive layer, the metal layer and the substrate are baked for thermosetting the polymeric adhesive.

10 Claims, 4 Drawing Sheets

METHOD OF FABRICATING AN ENVIRONMENTAL FRIENDLY CLADDING LAYER

RELATED APPLICATIONS

This application is a continuation-in-part of Application Ser. No. 11/431,698, filed on May 11, 2006, the disclosure of which is hereby incorporated by reference in its entirety.

BACKGROUND

1. Field of Invention

The present invention relates to a method of fabricating a cladding layer. More particularly, the present invention relates to a method of fabricating an environmentally friendly cladding layer.

2. Description of Related Art

Electroplating is commonly used for treating surface. Electroplating is an electrolytic process, in which an anode metal plate and a cathode are dipped in a bath filled with an appropriate electrolyte. The electrolyte is usually an ionic solution of the anode metal. While electric current passes through the anode and the cathode, metal ions in the electrolyte are attracted to the cathode while the anode is dissolved to provide more metal ions, thus depositing the metal on the surface of the cathode.

The waste liquid of an electroplating process often contains hazardous pollutants, such as heavy metal ions or cyanide. Therefore, the selection of suitable plating solvent and concentration of heavy metal ions should be carefully considered. However, untreated electroplating liquid containing hazardous pollutants or spent waste of the electroplating process that fail to satisfy the effluent standard still found its way into sewers, and causes serious pollution of groundwater, rivers and oceans. As a result, human health is directly and/or indirectly affected accordingly.

Compared with electroplating, other plating method, such as sputtering, which is less cost-effective, also has pollution problems, and often requires longer processing time, and is not applicable on a large substrate or may not yield a uniform coating thickness on the substrate.

Thus, there exists in this art an improved method of fabricating an environmentally friendly cladding layer that is free of the afore-mentioned problems.

SUMMARY

In one aspect, this present invention provides a method of fabricating an environmentally friendly cladding layer to solve the pollution problems caused from the traditional methods and reaches the same plating effect without the electrolytic solution.

In another aspect, this present invention provides a method of fabricating rolled metal layers to obtain large areas of metal layer that may be used to plate a large substrate, which may be made of a material selected from the group consisting of metal, ceramic and plastic.

In yet another aspect, this present invention provides a quick plating method. A metal cladding structure is provided beforehand to save time, said metal cladding structure can subsequently be used to cover a surface of a substrate intended to be plated with a metal layer. Furthermore, the present invention can be applied on a rough surface of the substrate, so as to produce a uniform metal layer to a certain thickness on the rough surface of the substrate.

In accordance with the foregoing and other aspects of the present invention, the present invention provides a method of fabricating an environmentally friendly cladding layer. First, a metal layer is deposited on a hydrolysis film by a vacuum evaporation method. Then, the hydrolysis film is immersed in water after a polymeric adhesive layer is formed on the metal layer. Alternatively, the polymeric adhesive layer is formed on the metal layer after the hydrolysis film is immersed in water.

Next, a substrate is adhered to the metal layer through the polymeric adhesive layer. After the hydrolysis film is hydrolyzed to form a semi-dissolved hydrolysis film, the semi-dissolved hydrolysis film on the metal layer is washed and then dried to remove the water. Finally, the polymeric adhesive layer, the metal layer and the substrate are baked to thermoset the polymeric adhesive layer. A polymeric protective layer is optionally formed on the substrate and the metal layer according to the demands. Then, the polymeric protective layer is baked to thermoset the polymeric protective layer.

According to another embodiment of the present invention, a method of fabricating an environmentally friendly cladding layer is provided. First, a metal layer is deposited on a hydrolysis film by a vacuum evaporation method. A polymeric adhesive layer is formed on the metal layer. Then, a release paper is formed on the polymeric adhesive layer to protect the polymeric adhesive layer temporarily so as to preserve the stickiness of the polymeric adhesive layer. Therefore, the time taken to plate the metal cladding structure on the substrate is greatly reduced.

The release paper is torn and then the substrate is glued on the metal layer through the polymeric adhesive layer. The polymeric adhesive layer, the metal layer and the substrate are baked to thermoset the polymeric adhesive layer. Then, the hydrolysis film is immersed in water and hydrolyzed to form a semi-dissolved hydrolysis film. After that, the semi-dissolved hydrolysis film is washed and then the metal layer is dried. The cladding structure is baked. Finally, a polymeric protective layer is optionally formed on the substrate and the metal layer according to the demands and then baked to thermoset the polymeric protective layer.

Thus, the present invention provides a method of fabricating an environmentally friendly cladding layer to solve the pollution problems inherent in the conventional methods. A vacuum evaporation method is used to alleviate the problems of non-uniformly deposited metal layer as yielded by the costly and time-consuming sputtering method of the prior art. Moreover, larger areas of the metal layer can be obtained to plate a large substrate by use of a rolled metal cladding layer in a vacuum evaporation system.

Furthermore, the present invention can produce a metal cladding structure beforehand, so that the pre-produced metal cladding structure may be quickly applied onto the substrate during plating and thereby saving even more time. The present invention can be applied on a rough surface of a substrate; therefore a metal layer having uniform thickness is plated on the rough surface of the substrate. Moreover, the present invention can also be applied onto a surface of a decorative ornament.

BRIEF DESCRIPTION OF THE DRAWINGS

The invention can be more fully understood by reading the following detailed description of the preferred embodiment, with reference made to the accompanying drawings as follows.

DESCRIPTION OF THE PREFERRED EMBODIMENTS

Figure 1:
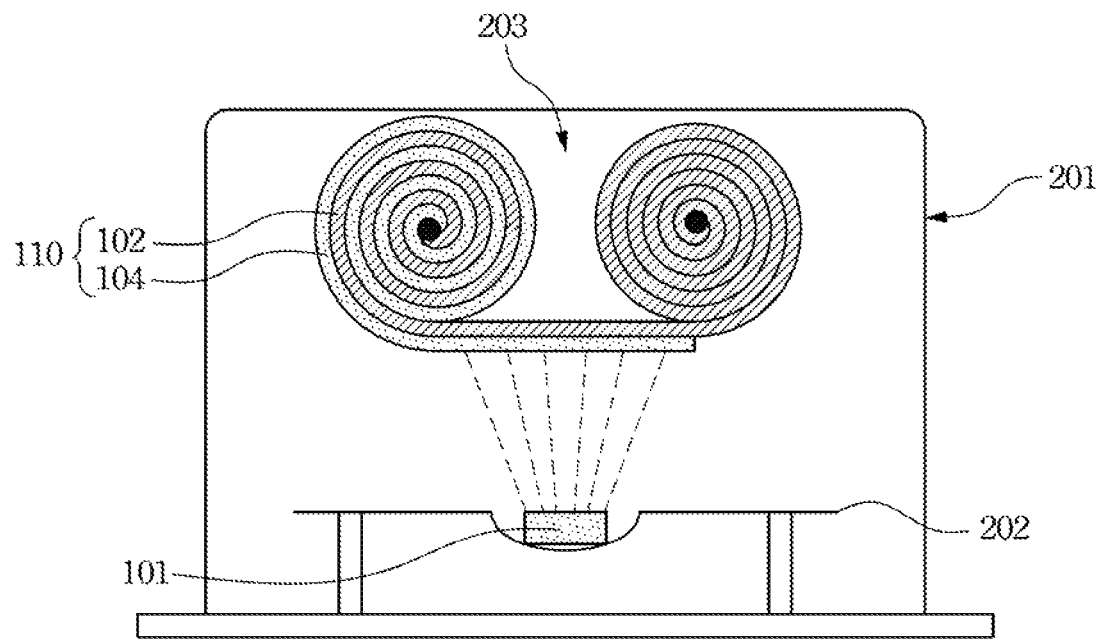
FIG. 1 is a schematic diagram showing metal materials in a vacuum evaporation system according to one embodiment of the present invention.

The present invention may solve the pollution problems often associated with the conventional methods, and is characterized in using a vacuum evaporation method to alleviate the problem of a deposited metal layer having non-uniformly thickness that is often found in the costly and time-consuming sputtering method. Reference will now be made in detail to the present preferred embodiments of the invention, examples of which are illustrated in the accompanying drawings. Wherever possible, the same reference numbers are used in the drawings and the description to refer to the same or like parts.

The present invention provides a plating method that uses water instead of an electrolytic solution. Further, the present method may still provide the same plating effect as that of a conventional plating method, which employs an electrolytic solution.

FIG. 1 is a schematic diagram showing metal materials in a vacuum evaporation system according to one embodiment of the present invention. In FIG. 1, a metal material 101 is positioned on a bowl 202 in a vacuum evaporation system 201. The metal material 101 is preferably any of Au, Ag, Co, Fe, Al, Zn, Sn, Co, Sb, Pb, Ni, or an alloy thereof.

Then, the metal material 101 is evaporated by a vacuum evaporation method to form a metal layer 104 on a hydrolysis film 102. The hydrolysis film 102 and the metal layer 104 together constitute a metal cladding layer 110. The thickness of the metal layer 104 may be tens of nanometers to hundreds of nanometers. The hydrolysis film 102 is a water-soluble polymer that is preferably a polyvinyl alcohol. If a metal layer 104 having a larger area is desired, then the hydrolysis film 102 can be rolled up and placed on a rolling device 203, and then the metal layer 104 is deposited on the hydrolysis film 102, so as to form the metal cladding layer 110 having a larger area.

Figure 2:
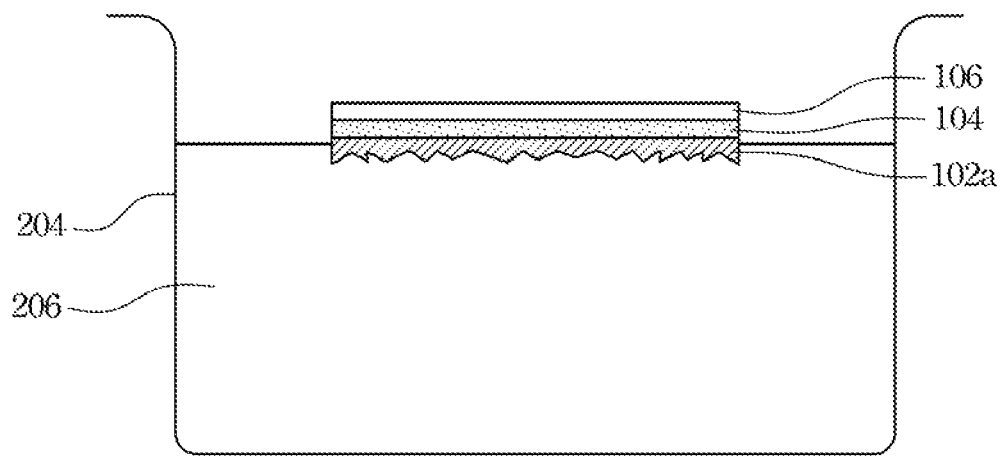
FIG. 2 is a schematic diagram showing the hydrolysis film immersed in water according to one embodiment of the present invention.

A polymeric adhesive is used for adhering the metal layer 104 to a substrate according to one embodiment of the present invention. FIG. 2 is a schematic diagram depicting the hydrolysis film being immersed in water according to one embodiment of the present invention. The metal cladding layer 110 is removed from the vacuum evaporation system 201. Subsequently, a polymeric adhesive is coated uniformly on the metal layer 104 to form a polymeric adhesive layer 106 before immersing the hydrolysis film 102 in a container 204 filled with water 206. Alternatively, the metal layer 104 is uniformly coated with the polymeric adhesive after the hydrolysis film 106 is immersed in the container 204 filled with water 206.

The polymeric adhesive is preferably composed of a material selected from epoxy resin, polyurethane resin, acrylic resin, phenolic resin and urea resin. However, the hydrolysis film 102 is made of a water-soluble polymer, hence the hydrolysis film 102 is partially hydrolyzed in water 206 and therefore forms a semi-dissolved hydrolysis film 102a after the hydrolysis film 102 is immersed in water 206.

Figure 3:
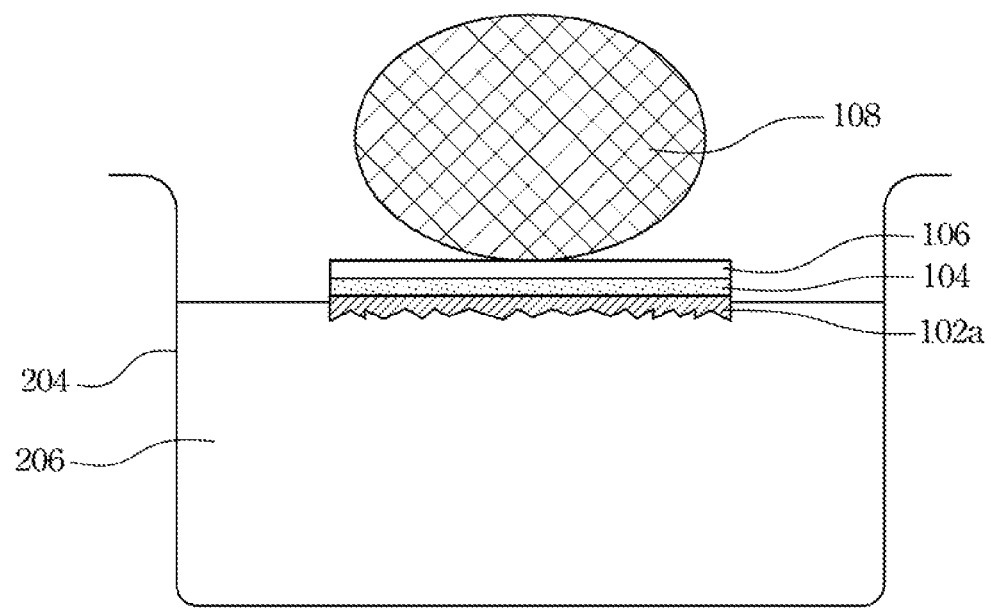
FIG. 3 is a schematic diagram showing the polymeric adhesive positioned on the substrate according to one embodiment of the present invention.

FIG. 3 is a schematic diagram depicting a substrate disposed on the is polymeric adhesive according to one embodiment of the present invention. In FIG. 3, a substrate 108 is positioned on the polymeric adhesive layer 106. At this time, only the center area of the polymeric adhesive layer 106 is glued on the substrate 108 and the other area of the polymeric adhesive layer 106 is not adhered to the substrate 108. The substrate 108 is made of a material including, but is not limiting to, metal, ceramic, plastic, and other materials.

Figure 4:
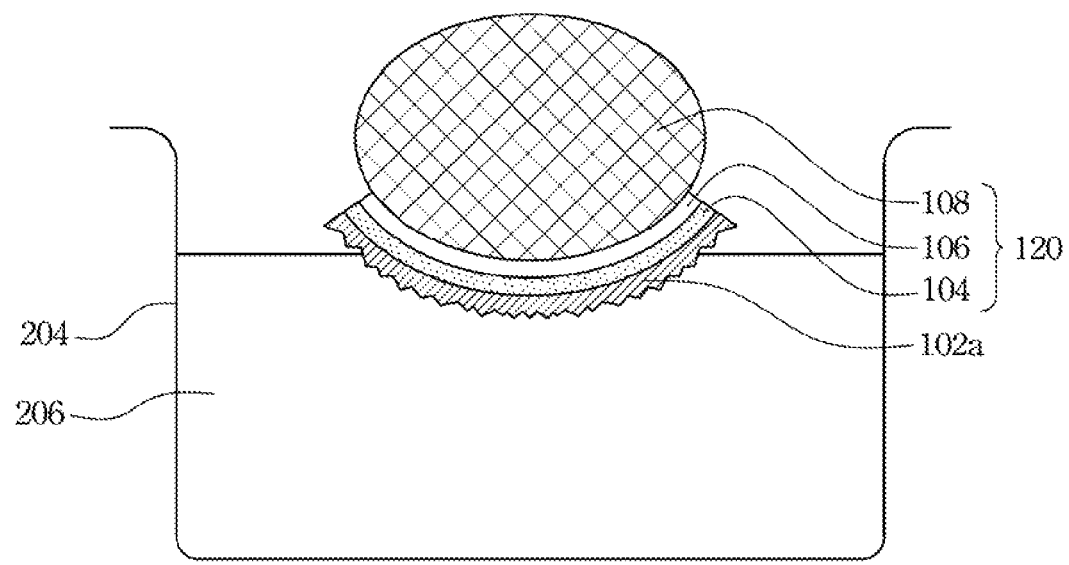
FIG. 4 is a schematic diagram showing the metal layer adhered to the substrate through the polymeric adhesive.

FIG. 4 is a schematic diagram depicting the metal layer adhered to the substrate through the polymeric adhesive. In FIG. 4, the substrate 108 falls by gravity to let the other areas of the polymeric adhesive layer 106 and the metal layer 104 cover the surface of the substrate 108 so that the metal layer 104 can be adhered to the surface of the substrate 108 uniformly.

After that, the semi-dissolved hydrolysis film 102a on the metal layer 104 is washed with clean water and then the metal layer 104 is dried to remove residual water. Therefore, a cladding structure 120 is formed, which is composed of the metal layer 104, the polymeric adhesive layer 106 and the substrate 108.

Finally, the cladding structure 120 is removed from the container 204 and then baked at a preferred temperature to thermoset the polymeric adhesive layer 106 to adhere the metal layer 104 to the substrate 108 firmly. The preferred temperature can be determined according to the demands and/or the types of the substrate intended to be plated. For example, if the substrate is a metal, the preferred temperature is about 100° C. and the baking time is preferably about half an hour. If the substrate is not a metal, the temperature is preferably at about 60° C. and the baking time is preferably set at about half an hour.

Subsequently, a polymeric protective layer may be formed on the surface of the cladding structure 120 to protect the substrate 108 and the metal layer 104 of the cladding structure 120. The polymeric protective layer is preferably made of polyurethane. Then, the protective layer is baked at a preferred temperature to thermoset the polymeric protective layer. The preferred temperature is the same as the preferred temperature of the cladding structure 120 mentioned above.

Figure 5:
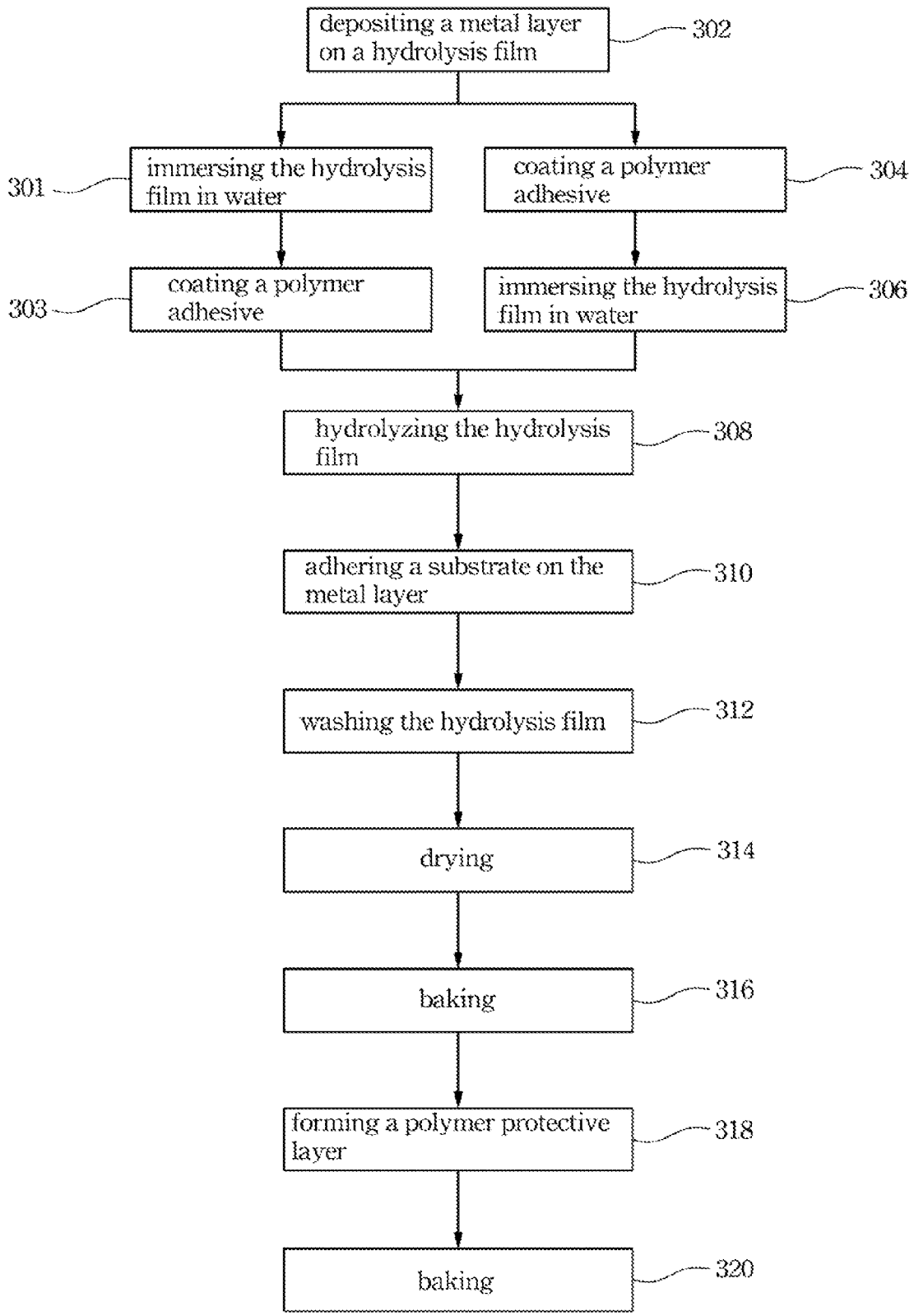
FIG. 5 is a flowchart of fabricating an environmentally friendly cladding is layer according to one embodiment of the present invention.

FIG. 5 is a flowchart of fabricating an environmentally friendly cladding layer according to one embodiment of the present invention. Reference is made to FIGS. 1 to 4. In step 302, a metal layer is deposited on a hydrolysis film. Then, a polymer adhesive is coated on the metal layer (step 304) before the hydrolysis film is immersed in water (step 306). Alternatively, the hydrolysis film is immersed in water (step 301) before the polymeric adhesive is coated on the metal layer (step 303).

Next, the hydrolysis film is hydrolyzed to form a semi-dissolved hydrolysis film in step 308. A substrate is adhered to the metal layer through the polymeric adhesive in step 310. The semi-dissolved hydrolysis film on the metal layer is washed in step 312 and then the metal layer is dried in step 314. In step 316, the polymeric adhesive, the metal layer and the substrate are baked. Finally, a polymeric protective layer is formed according to the demands in step 318 and then the polymeric protective layer is baked in step 320.

Figure 6:
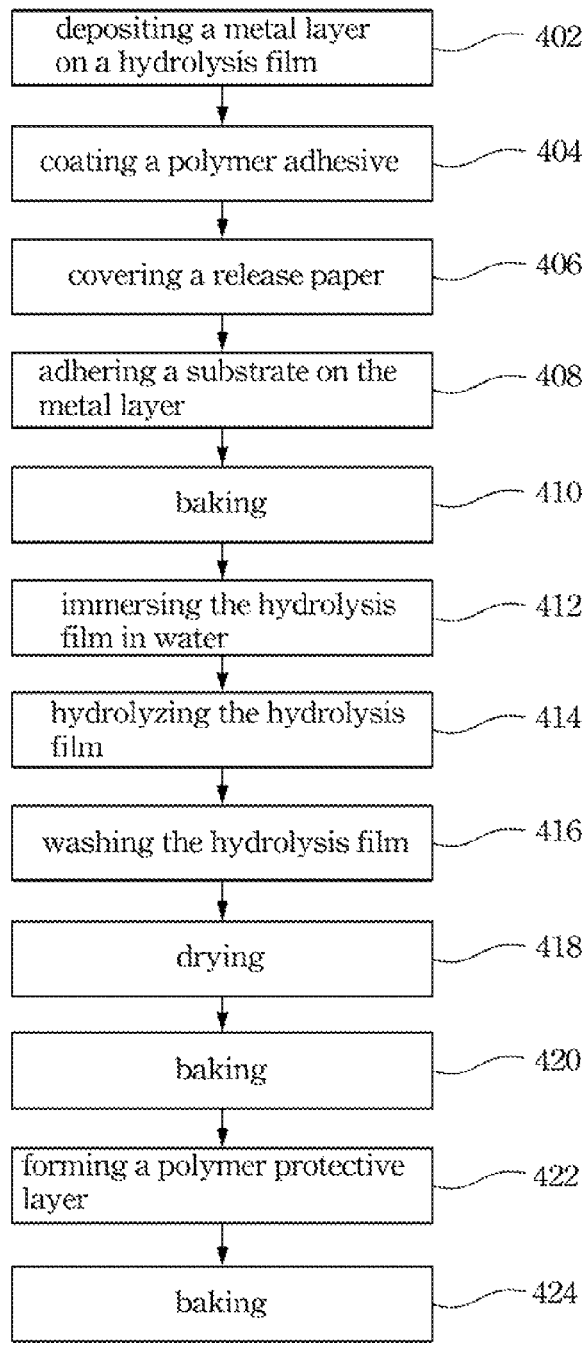
FIG. 6 is a flowchart of fabricating an environmentally friendly cladding material according to another embodiment of the present invention.

However, the steps mentioned above can be adjusted to obtain a commercialized metal layer according the demands. FIG. 6 is a flowchart of fabricating an environmentally friendly cladding layer according to another embodiment of the present invention. First, a metal layer is deposited on a hydrolysis layer by a vacuum evaporation method in step 402. A polymeric adhesive is coated on the metal layer in step 404. However, the difference from the embodiment mentioned above is that the polymeric adhesive is covered by a release paper so as to protect the polymeric adhesive temporarily (step 406) and preserve the stickiness of the polymeric adhesive. Therefore, a commercial metal cladding structure is obtained and thus plating time of the metal cladding structure covered on the substrate can be reduced.

The release paper is peeled away and then the substrate is glued on the metal layer through the polymeric adhesive layer in step 408. The polymeric adhesive layer, the metal layer and the substrate are baked in step 410. Then, the hydrolysis film is immersed in water in step 412 and hydrolyzed in step 414 to form a semi-dissolved hydrolysis film. After that, the semi-dissolved hydrolysis film is washed in step 416 and then the metal layer is dried in step 418. The cladding structure is baked in step 420. Finally, a polymeric protective layer is formed in step 422 and then baked in step 424.

Figure 7:
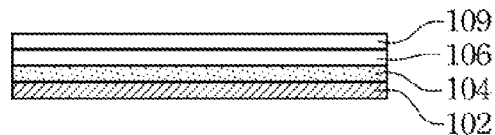
FIG. 7 is a schematic diagram showing a commercial metal cladding structure fabricated by performing step 402 to step 406 in FIG. 6.

The release paper is preferably silicone resin. FIG. 7 is a schematic diagram showing a commercial metal cladding structure obtained by performing step 402 to step 406 in FIG. 6. In FIG. 7, the release paper 109 mentioned above is used to cover and to protect the polymeric adhesive layer 106. The materials of the polymeric adhesive layer, the metal layer and the hydrolysis film are the same as those of the embodiment mentioned above.

Thus, the present invention provides a method of fabricating an environmentally friendly cladding layer to solve the pollution problems caused from the traditional methods. A vacuum evaporation method is used to solve is the problems of non-uniformly thick metal layer yielded by the costly and time-consuming sputtering method. Moreover, larger areas of the metal layer can be obtained to plate a large substrate by using a rolled metal cladding layer in a vacuum evaporation system.

Furthermore, the present invention can produce a metal cladding structure beforehand to be applied in plating the substrate quickly to save operation time. The present invention can plate a uniformly thick metal layer on a rough surface of an substrate. Moreover, the present invention can also be applied in a decorative ornament.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating an environmentally friendly cladding layer, the method comprising:

depositing a metal layer on a hydrolysis film by a vacuum evaporation method;

immersing the hydrolysis film in water;

coating a polymeric adhesive, which is unsolidified, on the metal layer;

adhering an substrate on the metal layer through the polymeric adhesive, wherein the substrate is made of a material selected from the group consisting of metal, ceramic and plastic;

hydrolyzing the hydrolysis film to remove the hydrolysis film; and baking the polymeric adhesive, the substrate and the metal layer to solidify the polymeric adhesive, wherein the step of adhering a substrate on the metal layer through the polymeric adhesive, and the step of hydrolyzing the hydrolysis film to remove the hydrolysis film are performed upon the surface of water.

2. The method of fabricating an environmentally friendly cladding layer of claim 1, wherein the metal layer is made of a material selected from a group consisting of Au, Ag, Co, Fe, Al, Zn, Sn, Co, Sb, Pb, Ni, and an alloy thereof.

3. The method of fabricating an environmentally friendly cladding layer of claim 1, wherein the hydrolysis film comprises a water-soluble polymer.

4. The method of fabricating an environmentally friendly cladding layer of claim 3, wherein the water-soluble polymer comprises a polyvinyl alcohol.

5. The method of fabricating an environmentally friendly cladding layer of claim 1, wherein the metal layer has a thickness of about tens of nanometers to hundreds of nanometers.

6. The method of fabricating an environmentally friendly cladding layer of claim 1, wherein the polymeric adhesive comprises a material selected from a group consisting of epoxy resin, polyurethane resin, acrylic resin, phenolic resin and urea resin.

7. The method of fabricating an environmentally friendly cladding layer of claim 1, wherein the baking, is performed at a temperature of about 60° C. to about 100° C. for about 30 minutes.

8. The method of fabricating an environmentally friendly cladding layer of claim 1, further comprising forming a polymeric protective layer on a surface of the substrate to form a protective layer, wherein the polymeric protective layer comprises polyurethane.

9. The method of fabricating an environmentally friendly cladding layer of claim 8, further comprising baking the polymeric protective layer to thermoset the polymeric protective layer.

10. The method of fabricating an environmentally friendly cladding layer of claim 1, after the step of immersing the hydrolysis film in water and before adhering an substrate on the metal layer through the polymeric adhesive, further comprising:

Semi-dissolving the hydrolysis film, as a carrier of the metal particles of the metal layer, in the water, so as to make the metal particles of the metal layer spread uniformly upon the surface of the water.

* * * * *